United States Patent
Eom et al.

(10) Patent No.: US 9,196,325 B2
(45) Date of Patent: Nov. 24, 2015

(54) INTEGRATED CIRCUIT WITH ON DIE TERMINATION AND REFERENCE VOLTAGE GENERATION AND METHODS OF USING THE SAME

(71) Applicant: Samsung Electronics Co., Ltd., Suwon-si (KR)

(72) Inventors: Yoon-Joo Eom, Hwaseong-si (KR); Byongmo Moon, Seoul (KR); Yongcheol Bae, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/248,447

(22) Filed: Apr. 9, 2014

(65) Prior Publication Data
US 2015/0023112 A1    Jan. 22, 2015

(30) Foreign Application Priority Data
Jul. 19, 2013  (KR) .......................... 10-2013-0085526

(51) Int. Cl.
| | |
|---|---|
| G11C 7/10 | (2006.01) |
| H03K 19/00 | (2006.01) |
| G11C 7/22 | (2006.01) |
| G11C 11/4076 | (2006.01) |
| G11C 11/4093 | (2006.01) |

(52) U.S. Cl.
CPC ............ *G11C 7/1084* (2013.01); *G11C 7/1057* (2013.01); *G11C 7/222* (2013.01); *G11C 11/4076* (2013.01); *G11C 11/4093* (2013.01); *H03K 19/0005* (2013.01); *G11C 2207/105* (2013.01); *G11C 2207/2272* (2013.01)

(58) Field of Classification Search
CPC ............ G11C 7/1084; G11C 11/4093; G11C 7/1057; G11C 7/222; G11C 11/4076; G11C 2207/2272; G11C 2207/105; G11C 29/02; G11C 5/063; G11C 7/04
See application file for complete search history.

(56) References Cited

U.S. PATENT DOCUMENTS

| | | | |
|---|---|---|---|
| 7,755,366 B2 | 7/2010 | Hosoe et al. | |
| 8,035,413 B2 | 10/2011 | Millar | |
| 8,106,676 B2 * | 1/2012 | Kaiwa et al. | 326/30 |
| 2009/0003089 A1 * | 1/2009 | Do | 365/189.09 |
| 2009/0153185 A1 | 6/2009 | Oh et al. | |
| 2009/0303802 A1 * | 12/2009 | Lee | 365/189.05 |
| 2010/0283503 A1 | 11/2010 | Hollis | |
| 2012/0007632 A1 | 1/2012 | Kang | |

(Continued)

FOREIGN PATENT DOCUMENTS

| | | |
|---|---|---|
| JP | 2007-241799 | 9/2007 |
| KR | 10-2008-0028656 A | 4/2008 |

(Continued)

*Primary Examiner* — Richard Elms
*Assistant Examiner* — Ajay Ojha
(74) *Attorney, Agent, or Firm* — Muir Patent Law, PLLC (57) ABSTRACT

An integrated circuit includes a data input such as a data pad for receiving an external data signal input and an on-die termination (ODT) information input for receiving ODT information from an external device. An ODT circuit selectively couples a termination resistor to the data pad based on the ODT information. An input buffer is coupled to the data pad for determining data that is input into the pad using a reference voltage. A reference voltage generator is coupled to the input buffer and generates the reference voltage on the basis of the ODT information.

14 Claims, 11 Drawing Sheets

(56) References Cited

U.S. PATENT DOCUMENTS

2012/0256654 A1 10/2012 Cho
2013/0002291 A1* 1/2013 Park ................................ 326/30
2013/0222009 A1* 8/2013 Kang ............................... 326/30

FOREIGN PATENT DOCUMENTS

| KR | 10-2009-0022043 A | 3/2009 |
| KR | 10-2009-0061758 A | 6/2009 |
| KR | 10-2012-0005343 A | 1/2012 |

\* cited by examiner

| RODT-PU | RON | VREF(×VDDQ) |
|---|---|---|
| 240.00 | 34.00 | 0.56 |
| 240.00 | 40.00 | 0.57 |
| 240.00 | 48.00 | 0.58 |
| 120.00 | 34.00 | 0.61 |
| 120.00 | 40.00 | 0.63 |
| 120.00 | 48.00 | 0.64 |

INTEGRATED CIRCUIT WITH ON DIE TERMINATION AND REFERENCE VOLTAGE GENERATION AND METHODS OF USING THE SAME

CROSS-REFERENCE TO RELATED APPLICATIONS

The present application claims priority under 35 U.S.C. §119 of Korean Patent Application No. 10-2013-0085526, filed on Jul. 19, 2013, the entire content of which is hereby incorporated herein by reference.

BACKGROUND OF THE INVENTION

The present inventions herein relate to integrated circuits, and more particularly, to a data input method of the integrated circuit.

On-die termination (ODT) has been developed as a way to improve signal integrity by minimizing signal reflection in an interface between components, such as between a memory controller and a semiconductor memory device. An ODT circuit can suppress signal reflection by providing a termination resistance that is matched to impedance of a transmission line, and beneficially do this without requiring external resistor elements and associated wiring on a circuit board that otherwise would conventionally be used. Thus, ODT allows for simpler and more cost-effective system designs that require fewer discrete components. An example of ODT can be found in U.S. Pat. No. 8,619,492, entitled "On-Die Termination Circuit, Memory Device, Memory Module, and Method of Operating and Training an On-Die Termination" the entire contents of which are hereby incorporated by reference (this patent discloses, for example, the use of transistors to selectively connect resistors between a reference voltage source and a chip's external pin to vary a termination resistance).

SUMMARY

Embodiments can provide an integrated circuit that includes a pad receiving data from an external device, with an ODT circuit connecting a termination resistor to the pad on the basis of ODT information which is input from the external device, an input buffer determining data which is input into the pad using a reference voltage to store the determined data, and a reference voltage generator generating the reference voltage on the basis of the ODT information.

Other embodiments also provide a data input method of an integrated circuit including at least one memory device and a memory controller controlling the memory device. The data input method of the integrated circuit may include receiving ODT information from the memory controller in the memory device, generating a reference voltage according to the ODT information, performing ODT termination on the basis of the ODT information, and determining data which is input into data pads using the reference voltage. The ODT information may comprise ODT on/off information indicating whether an ODT operation is performed or not, termination information related to a pull-up termination or a pull-down termination, and resistance information indicating an ODT resistance value.

Still other embodiments of an integrated circuit comprise a pad configured to receive an external data signal input, an on-die termination (ODT) information input configured to receive ODT information from an external device, an ODT circuit configured to selectively couple a termination resistor to the pad based on the ODT information, an input buffer coupled to the pad and configured to determine a data value based on a reference voltage, and a reference voltage generator coupled to the input buffer and configured to generate the reference voltage based on the ODT information. The ODT information may include on/off information indicating whether to perform an ODT operation, termination information indicating a pull-up termination or a pull-down termination, and resistance information indicating an ODT resistance value.

Embodiments may comprise a mode register configured to provide least a portion of the ODT information. The ODT circuit may include a pull-up termination circuit including a termination resistor selectively coupled between the pad and a power supply voltage based on the ODT information. The ODT circuit further may include a pull-down termination circuit including a termination resistor selectively coupled between the pad and a power supply voltage based on the ODT information. Embodiments may be DRAMs configured to receive ODT information from a memory controller.

In some embodiments, the reference voltage generator comprises a voltage divider configured to generate the reference voltage from a power supply voltage based on the ODT information. The reference voltage generator may be configured to generate a reference voltage of half the power supply voltage if the ODT information indicates an ODT off state. The reference voltage generator may be configured to generate a reference voltage of less than half of the power supply voltage if the ODT information indicates a pull-down termination. The reference voltage generator may be configured to generate a reference voltage of greater than half of the power supply voltage if the ODT information indicates a pull-up termination.

In some embodiments, the reference voltage generator comprises an external reference voltage input configured to receive an external reference voltage, a voltage divider configured to generate an internal reference voltage from a power supply voltage based on the ODT information, and a switch configured to select between the external reference voltage and the internal reference voltage as the reference voltage based on whether the ODT information indicates an ODT off state.

In still other embodiments, an integrated circuit further includes an output buffer separate from the input buffer. The output buffer includes the ODT circuit and is coupled to the pad and configured to output data through the pad.

In yet still other embodiments, an integrated circuit comprises a data pad and an on-die termination (ODT) circuit coupled to the data pad. The ODT circuit includes (i) an ODT information input, (ii) at least one termination resistor, and (iii) circuitry configured to selectively couple the termination resistor(s) to the data pad based on ODT information received from the ODT information input. A voltage reference generator is configured to generate a voltage reference based on the ODT information, and a data input buffer is coupled to the data pad and to the voltage reference generator.

In some embodiments, the voltage reference generator includes an input receiving an external voltage reference, a voltage divider configured to provide an internal voltage reference based on the ODT information, and a selection circuit configured to select based on the ODT information between the external voltage reference and the internal voltage reference to generate the voltage reference. The voltage reference generator may be configured to generate a reference voltage equal to one-half of a power supply voltage if the ODT information indicates not to perform an ODT operation. The voltage reference generator may be further configured to generate a reference voltage less than one-half of the power supply voltage if the ODT information indicates both to perform an ODT operation and a pull-down termination. The voltage reference generator may be further configured to generate a reference voltage greater than one-half of the power supply voltage if the ODT information indicates both to perform an ODT operation and a pull-up termination.

In still yet other embodiments, a data input method for a memory device configured to be coupled to a memory controller comprises receiving on-die termination (ODT) information from a memory controller, generating a reference voltage based on the ODT information, performing an ODT termination based on the ODT information, and determining a data value of a signal input into a data pad based on the reference voltage. The ODT information includes on/off information indicating whether to perform an ODT operation, termination information indicating a pull-up termination or a pull-down termination, and resistance information indicating an ODT resistance value.

In some embodiments, generating a reference voltage based on the ODT information comprises receiving an external voltage reference, providing an internal voltage reference based on the ODT termination information, and selecting the internal voltage reference as the reference voltage if the on/off information indicates to perform an ODT operation, or selecting the external voltage reference as the reference voltage if the on/off information indicates not to perform an ODT operation. Generating a reference voltage based on the ODT information may comprise generating a reference voltage equal to one-half of a power supply voltage if the on/off information indicates not to perform an ODT operation, generating a reference voltage less than one-half of the power supply voltage if the on/off information indicates to perform an ODT operation and the termination information indicates a pull-down termination and generating a reference voltage greater than one-half of the power supply voltage if the on/off information indicates to perform an ODT operation and the termination information indicates a pull-up termination.

BRIEF DESCRIPTION OF THE FIGURES

Embodiments of the inventions will be described below in more detail with reference to the accompanying drawings. The inventions may, however, be embodied in different forms and should not be construed as limited to the embodiments set forth herein. Rather, these embodiments are provided so that this disclosure will be thorough and complete, and will fully convey the scope of the inventions to those skilled in the art. Like numbers refer to like elements throughout the drawings, in which.

DETAILED DESCRIPTION OF PREFERRED EMBODIMENTS

Embodiments will be described more fully hereinafter with reference to the accompanying drawings. The inventions may, however, may be embodied in many different forms and should not be construed as limited to the embodiments set forth herein. Rather, these embodiments are provided so that this disclosure will be thorough and complete, and will fully convey the scope of the inventions to those skilled in the art. In the drawings, the size and relative sizes of layers and regions may be exaggerated for clarity. Like numbers refer to like elements throughout.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another. For example, a first chip could be termed a second chip, and, similarly, a second chip could be termed a first chip without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

An integrated circuit in accordance with some embodiments of the inventions can provide an input operation having optimum performance according to an operation frequency by varying, changing and controlling a reference voltage for data determination on the basis of on-die termination (ODT) information.

Figure 1:
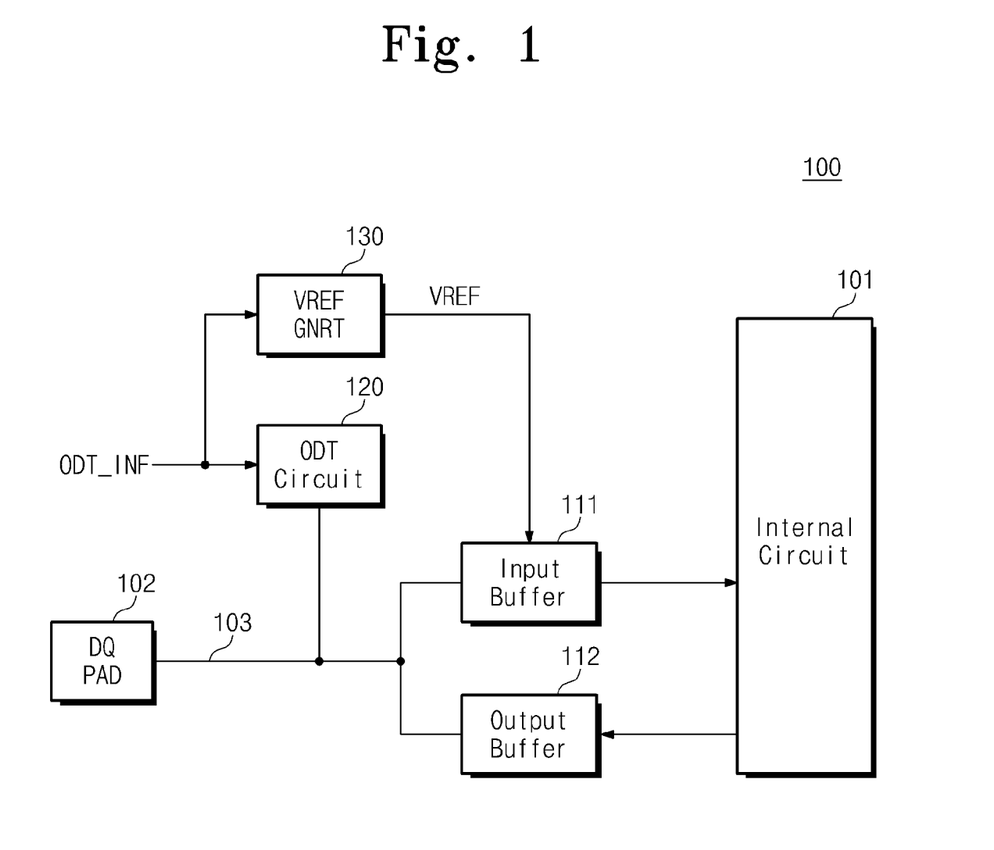
FIG. 1 is a block diagram illustrating a first embodiment of an integrated circuit including an ODT circuit and voltage generator.

FIG. 1 is a block diagram illustrating a first embodiment of an integrated circuit 100 in accordance with some embodiments. Referring to FIG. 1, the integrated circuit 100 includes an internal circuit 101, a data pad (DQ PAD) 102, an input buffer 111, an output buffer 112, an ODT circuit 120 and a reference voltage generator 130. For explanation purposes, one data pad 102 is illustrated in FIG. 1 but the integrated circuit 100 may include a plurality of data pads.

The internal circuit 101 may be a circuit to store or process data being input to and output from the data pad 102. For example, the internal circuit 101 may be a part of a volatile memory device or a nonvolatile memory device. While memory devices are well suited for embodiments of the inventions, the internal circuit 101 may be any circuit coupled to a data pad or other interface or input/output that can benefit from the use of ODT.

When a write operation (data input operation) is performed, the input buffer 111 receives external data through the data pad 102, distinguishes data on the basis of a reference voltage VREF and transmits the determined data to the internal circuit 101.

When a read operation (data output operation) is performed, the output buffer 112 receives read data from the internal circuit 101 and transmits the read data to the data pad 102.

In FIG. 1, the input buffer 111 and the output buffer 112 are connected to one data pad 102. However, embodiments of the inventions do not need to be limited thereto. Embodiments may include a data pad corresponding to the input buffer 111 and a data pad corresponding to the output buffer 112 separately.

When a write or read operation is performed, the ODT circuit 120 provides termination resistance to a signal line 103 to match impedance on the basis of ODT information. The ODT information may include ODT on/off information indicating whether ODT is turned on or off, termination information relating to a pull-up or pull-down termination (i.e., information related to whether to enable or perform or activate ODT using a pull-up or pull-down termination circuit), and resistance information indicating an ODT resistance value. The pull-up termination includes a termination resistance between a power supply voltage VDDQ (not shown) and the signal line 103 and the pull-down termination includes a termination resistance between the signal line 103 and a ground voltage VSSQ (not shown).

ODT information ODT_INF may be input at various times, such as before or as soon as a write or read operation is performed. Although not illustrated in the drawing, the ODT information ODT_INF may be set in a mode register set (MRS).

The ODT information ODT_INF can be input through a specific pad (ODT pad) (U.S. Pat. No. 8,619,492, mentioned above and incorporated by reference, discloses, for example, an ODT circuit coupled to an ODT buffer that is coupled to an ODT pin). The input for the ODT information ODT_INF can also be implemented other ways, such as through a command pad.

The reference voltage generator 130 generates a reference voltage VREF on the basis of the ODT information ODT_INF. The reference voltage VREF is a voltage for data determination and may be varied, changed and controlled according to the ODT information ODT_INF. That is, an optimal reference voltage VREF can be generated based on the ODT information ODT_INF.

Since in general integrated circuits determine an internal margin and a reference voltage level on the basis of an ODT turn-on state, the use of the same reference voltage level will not be optimal in an ODT turn-off state. On the other hand, the integrated circuit 100 in accordance with some embodiments generates a reference voltage VREF on the basis of the ODT information ODT_INF and thereby improves performance as compared with a conventional integrated circuit.

Figure 2:
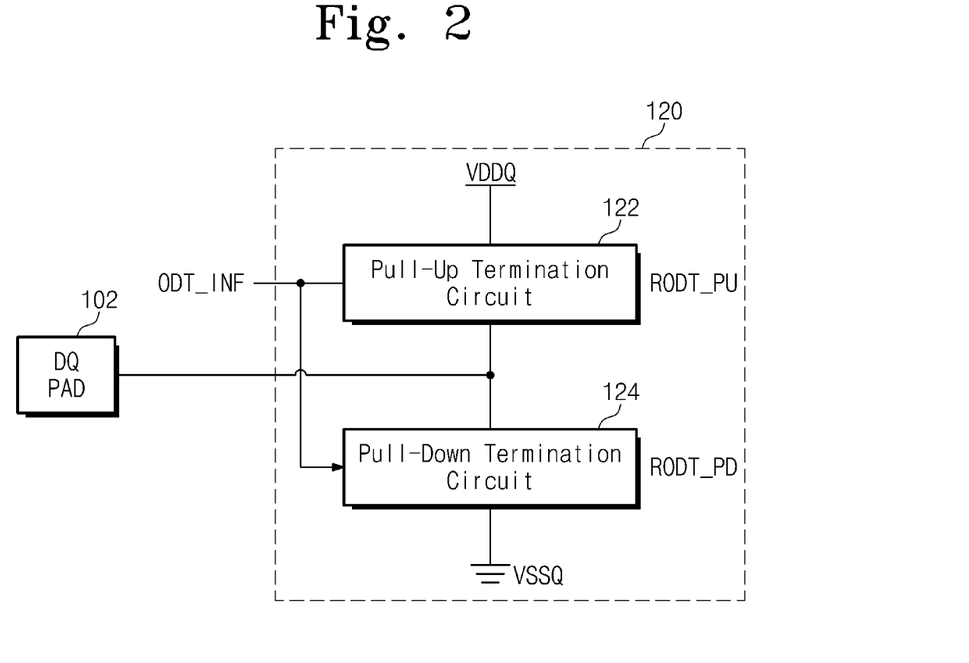
FIG. 2 is a block diagram illustrating an ODT circuit embodiment for use in the embodiment of FIG. 1.

FIG. 2 is a block diagram showing additional detail of an ODT circuit 120 illustrated in FIG. 1. Referring to FIG. 2, the ODT circuit 120 includes a pull-up termination circuit 122 and a pull-down termination circuit 124.

The pull-up termination circuit 122 is connected between the power supply voltage VDDQ and the signal line 103 and connects a pull-up resistance between the power supply voltage VDDQ and the signal line 103 on the basis of the ODT information ODT_INF. The resistance value of the pull-up resistance is referred to as RODT_PU.

The pull-down termination circuit 124 is connected between the ground voltage VSSQ and the signal line 103 and connects a pull-down resistance between the ground voltage VSSQ and the signal line 103 on the basis of the ODT information ODT_INF. The resistance value of the pull-down resistance is referred to as RODT_PD.

The ODT circuit 120 illustrated in FIG. 2 includes both the pull-up termination circuit 122 and the pull-down termination circuit 124. In other embodiments an ODT circuit 120 may include one or the other of the pull-up termination circuit 122 and the pull-down termination circuit 124.

The ODT circuit 120 can perform an on-die termination (ODT) operation on the basis of the ODT information ODT_INF. Any one of the pull-up termination circuit 122 and the pull-down termination circuit 124 may be activated according to the ODT information ODT_INF.

Figure 3:
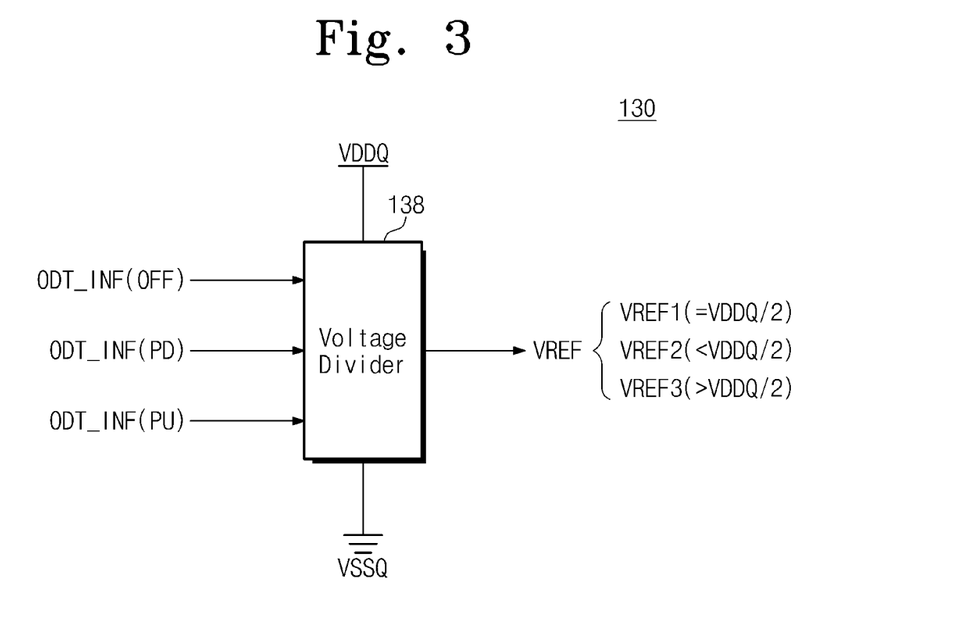
FIG. 3 is a block diagram illustrating a first embodiment of a reference voltage generator illustrated in FIG. 1.

FIG. 3 is a block diagram illustrating a first embodiment of a reference voltage generator illustrated in FIG. 1. Referring to FIG. 3, the reference voltage generator 130 includes a voltage divider 138 that generates a reference voltage VREF on the basis of the input ODT information ODT_INF. For clarity of illustration, separate lines are shown for different permutations of ODT_INF input to circuit 138. The specific details of circuits to generate a reference voltage are well understood by those of skill in the art, and techniques and circuits for Voltage Divider 138 may include relatively simple linear circuits with at least some circuit elements controlled on the basis of the ODT information, or more complex voltage generator circuits may be used as desired to generate particular voltage reference values based on particular values of the ODT information.

In the embodiment of FIG. 3, if the voltage divider/generator 138 receives ODT information ODT_INF(OFF) indicating an ODT off, then the circuit 138 will output a first reference voltage VREF1. The first reference voltage VREF1 is half of the power supply voltage VDDQ.

If the voltage divider 138 receives ODT information ODT_INF(PD) indicating a pull-down termination, then the circuit 138 will output a second reference voltage VREF2. The second reference voltage VREF2 is smaller than the first reference voltage VREF1.

If the voltage divider 138 receives ODT information ODT_INF(PU) indicating a pull-up termination, then the circuit 138 will output a third reference voltage VREF3. The third reference voltage VREF3 is greater than the first reference voltage VREF1.

Thus, the reference voltage generator 130 illustrated in FIG. 3 generates a reference voltage VREF that can be one of three reference voltages VREF1, VREF2 and VREF3. However, the number of the reference voltages is not limited to this example. A reference voltage generator 130 can generate various reference voltages as desired on the basis of the input ODT information ODT_INF.

In this exemplary illustration of FIG. 3, the reference voltage generator 130 can embody three kinds (exclusive use of off/exclusive use of pull-up termination/exclusive use of pull-down termination) of reference voltage generators.

Figure 4:
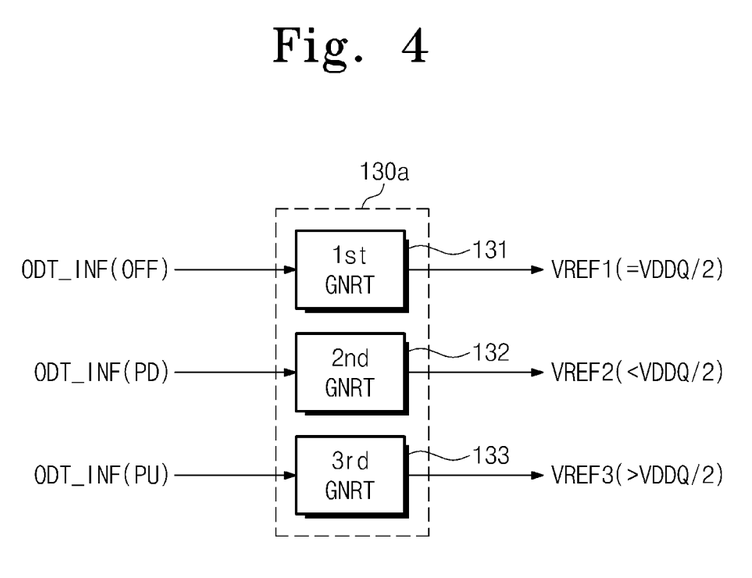
FIG. 4 is a block diagram illustrating a second embodiment of a reference voltage generator illustrated in FIG. 1.

FIG. 4 is a block diagram illustrating a second embodiment of a reference voltage generator that may be used in the example of in FIG. 1. Referring to FIG. 4, a reference voltage generator 130a includes a first reference voltage generator 131, a second reference voltage generator 132 and a third reference voltage generator 133.

The first reference voltage generator 131 receives ODT information ODT_INF(OFF) indicating an ODT off, which it uses as a basis to output a first reference voltage VREF1. The first reference voltage VREF1 is half of the power supply voltage VDDQ.

The second reference voltage generator 132 receives ODT information ODT_INF(PD) indicating a pull-down termination, which it uses as a basis to output a second reference voltage VREF2. The second reference voltage VREF2 is smaller than the first reference voltage VREF1.

The third reference voltage generator 133 receives ODT information ODT_INF(PU) indicating a pull-up termination, which it uses as a basis to output a third reference voltage VREF3. The third reference voltage VREF3 is greater than the first reference voltage VREF1.

The reference voltage generator 130a may include any number of such reference voltage generators 131, 132 and 133 corresponding to the type of ODT (including whether ODT will be enabled or performed).

In the case of the pull-up termination, a method of generating the third reference voltage VREF3 is described below. For explanation purposes, it will be assumed that an ODT resistance value is an ON-resistance value RON indicating the driving of the output buffer 112. Since the ODT resistance value is embodied using the ON-resistance RON, the ODT resistance value is equal to or smaller than the ON-resistance value RON.

Figure 5:
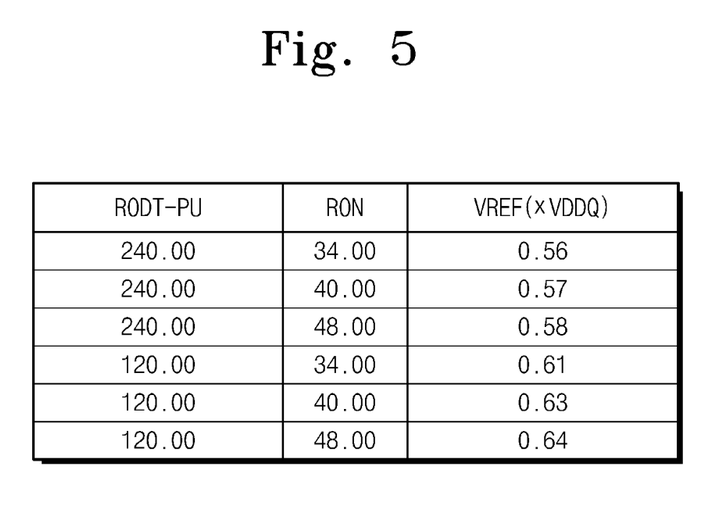
FIG. 5 is a table illustrating a reference voltage based on ODT information when pull-down termination in accordance with some embodiments is performed.

FIG. 5 is a table illustrating a reference voltage VREF based on ODT information when pull up termination in accordance with some embodiments of is performed. In some embodiments, the reference voltage VREF satisfies the mathematical formula:

$$VREF = \left(1 - \frac{RODT\_PU}{2(RODT\_PU + RON)}\right)VDDQ$$

In this formula, RODT_PU is a pull-up resistance value and VDDQ is a power supply voltage.

Referring to FIG. 5, when the pull-down resistance value RODT_PU is reduced from 240Ω to 120Ω, the reference voltage VREF increases. Also, as the ON-resistance value RON increases, the reference voltage VREF increases.

Similarly, in the case of the pull-down termination (or VSSQ termination), the reference voltage VREF (the second reference voltage VREF2 of FIGS. 3 and 4) satisfies the mathematical formula:

$$VREF = \left(1 - \frac{RON}{2(RODT\_PD + RON)}\right)VDDQ$$

In this formula, RODT_PD is a pull-up resistance value and RON is an ON-resistance value.

Figure 6:
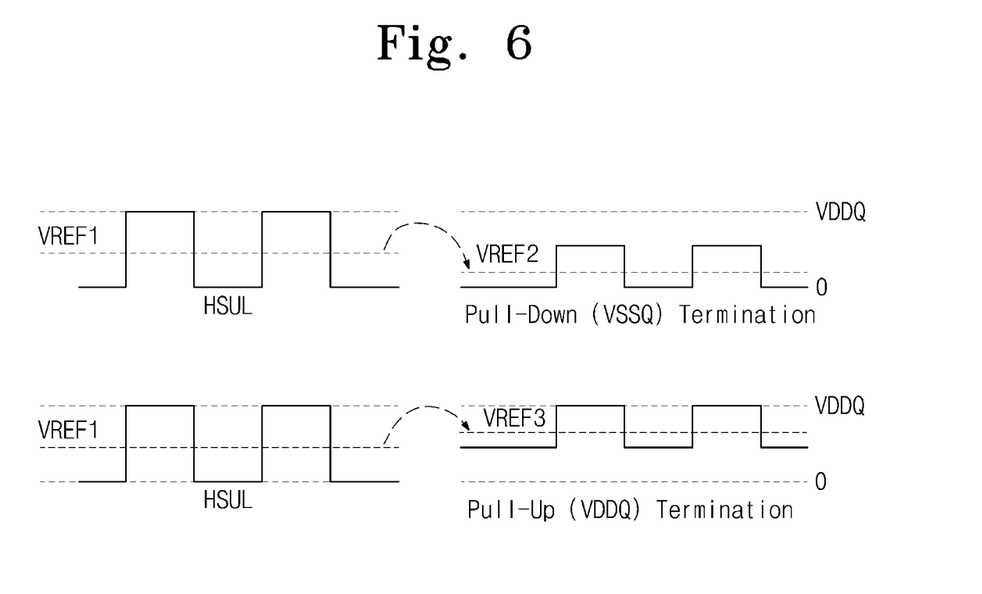
FIG. 6 is a waveform drawing illustrating a change of a reference voltage on the basis of ODT information in accordance with some embodiments.

FIG. 6 is a drawing illustrating a change of a reference voltage on the basis of ODT information in accordance with some embodiments. Referring to FIG. 6, when an operation frequency of the integrated circuit 100 is a low frequency, the ODT information ODT_INF will typically indicate ODT off. At this time, the reference voltage VREF is the first reference voltage VREF1, which is half of the power supply voltage VDDQ.

In the case that the ODT information ODT_INF changes from indicating ODT off to ODT on and indicates a pull-down termination VSSQ, the reference voltage VREF will become the second reference voltage VREF2, which as illustrated is smaller than the first reference voltage VREF1.

In the case that the ODT information ODT_INF changes from indicating ODT off to ODT on and indicates a pull-up termination VDDQ, the reference voltage VREF will become the third reference voltage VREF3, which as illustrated is larger than the first reference voltage VREF1.

Thus, this shows one example of how reference voltage VREF can be varied based on the ODT information ODT_INF.

Figure 7:
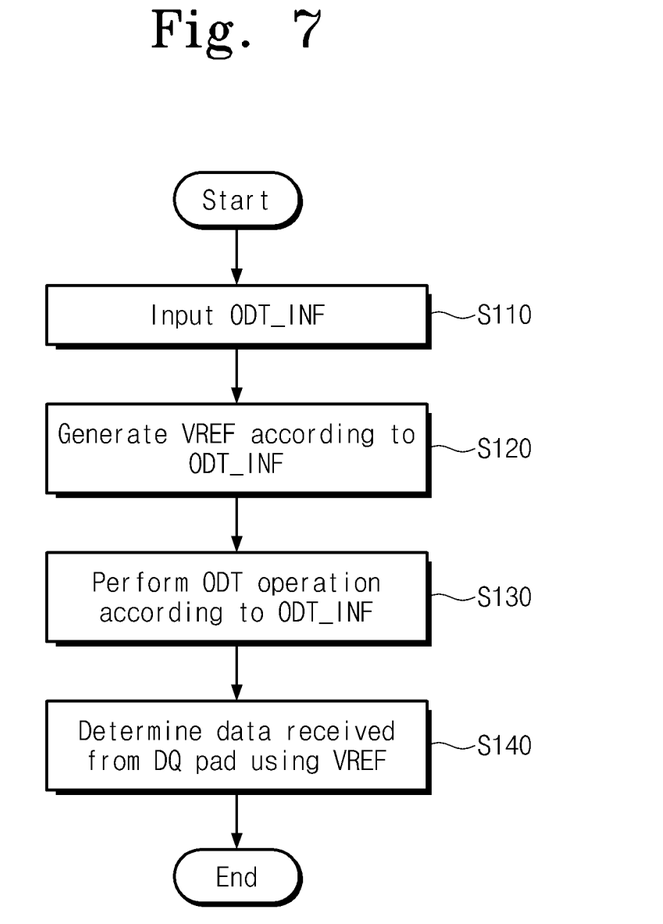
FIG. 7 is a flow chart illustrating a data input method of an integration circuit in accordance with some embodiments.

FIG. 7 is a flow chart illustrating a data input method of an integrated circuit in accordance with some embodiments. Referring to FIGS. 1 through 7, the data input method is as follows. When an input operation (or a write operation) of the integrated circuit 100 is performed, ODT information ODT_INF is input (S110). The ODT information ODT_INF may include ODT on/off information, termination information and ODT resistance values. A mode register set can be set based on the ODT information ODT_INF. The reference voltage generator 130 generates the reference voltage VREF by performing a trim operation of a default reference voltage (e.g., VDDQ/2) on the basis of the ODT information ODT_INF (S120). Data input from the data pad 102 is determined using the generated reference voltage VREF.

The data input method uses the reference voltage VREF generated based on the ODT information ODT_INF to distinguish data.

The ODT circuit 120 illustrated in FIG. 1 is outside the output buffer 112. However, embodiments do not need to be limited to this example. In other embodiments the ODT circuit can exist inside the output buffer.

Figure 8:
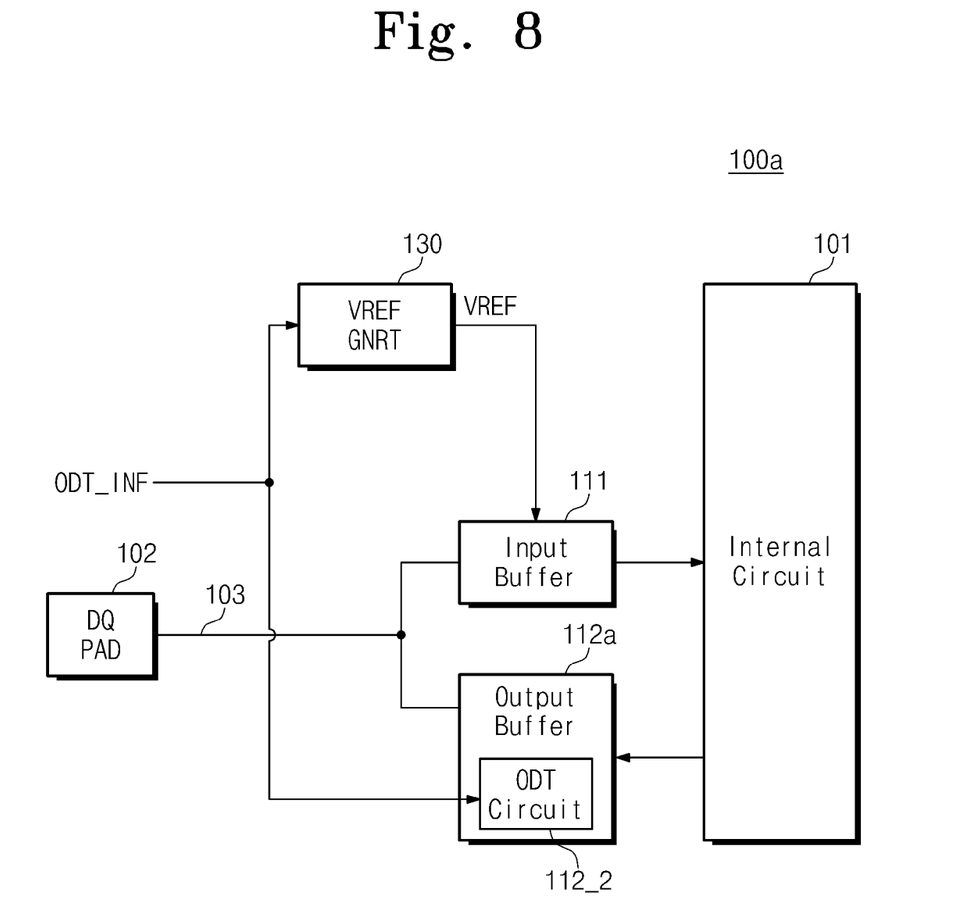
FIG. 8 is a block diagram illustrating another embodiment of an integrated circuit.

FIG. 8 is a block diagram illustrating an alternative embodiment of an integrated circuit 100a. The integrated circuit 100a is essentially the same as the integrated circuit 100 illustrated in FIG. 1 except that an ODT circuit 112_2 exists inside an output buffer 112a.

The integrated circuit 100a can incorporate the ODT circuit 112_2 to use a resistance value of the output buffer 112a.

In the embodiments of FIGS. 1 through 8, the reference voltage VREF is generated from the inside of the integrated circuit (100, 100a). However, in alternative embodiments the reference voltage VREF may at least in part be generated from outside the integrated circuit, such as via an input from an external device.

Figure 9:
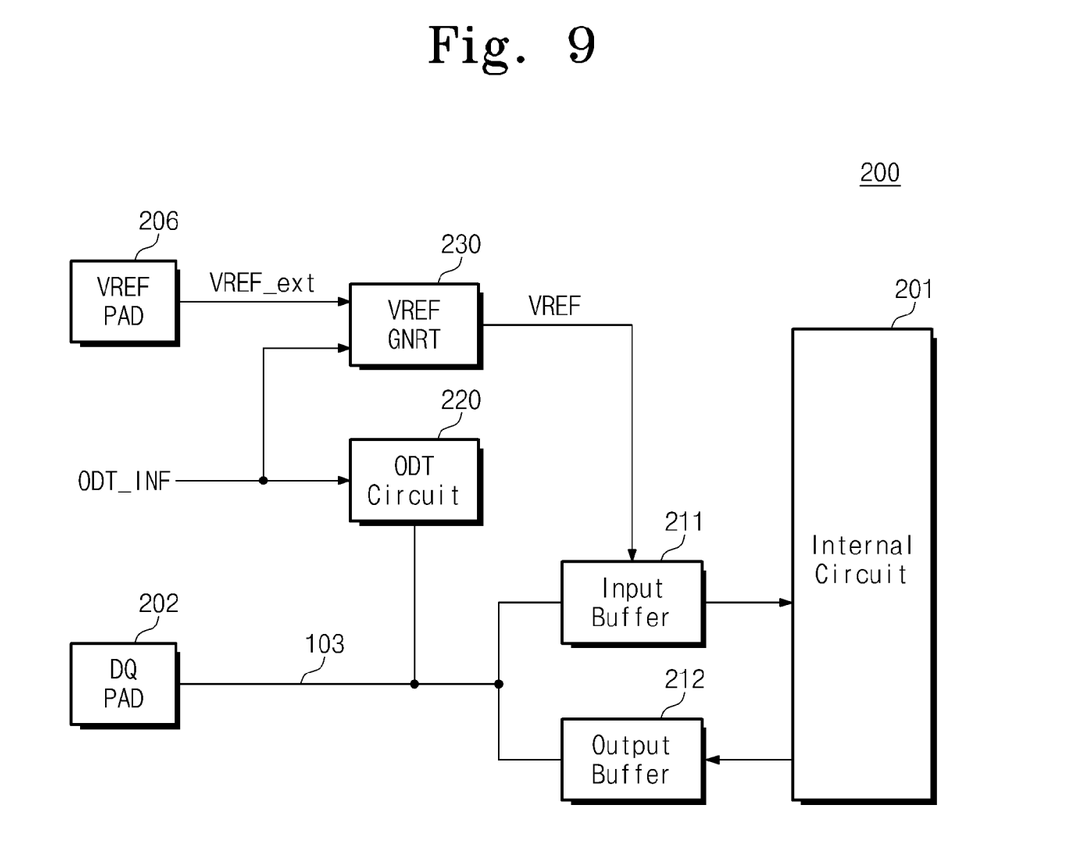
FIG. 9 is a block diagram illustrating yet another embodiment of an integrated circuit.

FIG. 9 is a block diagram illustrating another alternative embodiment of an integrated circuit in accordance with some embodiments. Referring to FIG. 9, an integrated circuit 200 includes an internal circuit 201, a data pad 202, a reference voltage pad 206, an input buffer 211, an output buffer 212, an ODT circuit 220 and a reference voltage generator 230. The integrated circuit 220 is in most aspects the same as the integrated circuit 100 illustrated in FIG. 1, except for the reference voltage pad 206 and the reference voltage generator 230.

The reference voltage pad 206 receives an external reference voltage VREF_ext from an external device.

The reference voltage generator 230 outputs as a reference voltage VREF either the external reference voltage VREF_ext received from the reference voltage pad 206 or an internal reference voltage VREF_int generated based on the ODT information ODT_INF.

Figure 10:
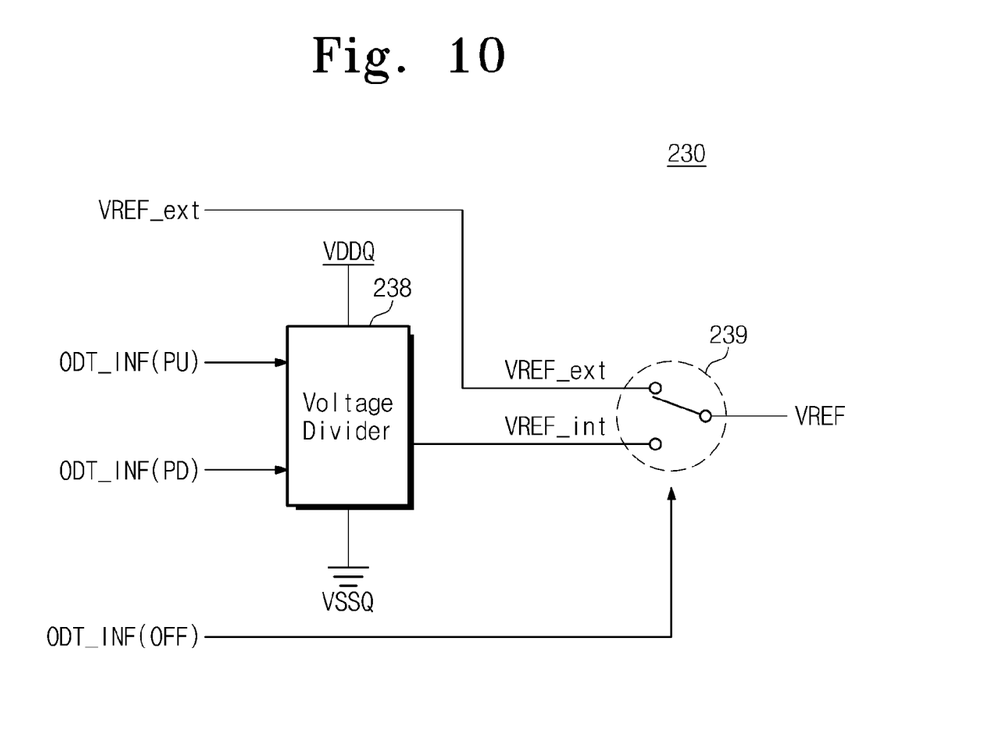
FIG. 10 is a block diagram illustrating details of a reference voltage generator for the embodiment of FIG. 9.

FIG. 10 is a block diagram illustrating an embodiment of the reference voltage generator 230 illustrated in FIG. 9. Referring to FIG. 10, the reference voltage generator 230 includes a voltage divider 238 and a switch 239.

The voltage divider 238 receives ODT information ODT_INF (PU) indicating a pull-up termination or ODT information ODT_INF (PD) indicating a pull-down termination to generate a corresponding internal reference voltage VREF_int.

The switch 239 selects either the external reference voltage VREF_ext or the internal reference voltage VREF_int on the basis of ODT on/off information ODT_INF (OFF) as the reference voltage VREF. For example, when the ODT on/off information ODT_INF (OFF) indicates ODT off, the switch 239 selects the external reference voltage VREF_ext as the reference voltage VREF. The external reference voltage VREF_ext is a default reference voltage value and may be half of the power supply voltage VDDQ.

This embodiment provides a mechanism to, for example, address the case that the integrated circuit (100, 200) requires a more accurate reference voltage VREF then the ODT circuit (130, 230) is capable of. In this case, the ODT on/off information ODT_INF (OFF) includes information indicating to receive the external reference voltage VREF_ext.

The reference voltage generator 230 can output any one of the external reference voltage VREF_ext and the internal reference voltage VREF_int as a reference voltage VREF.

Figure 11:
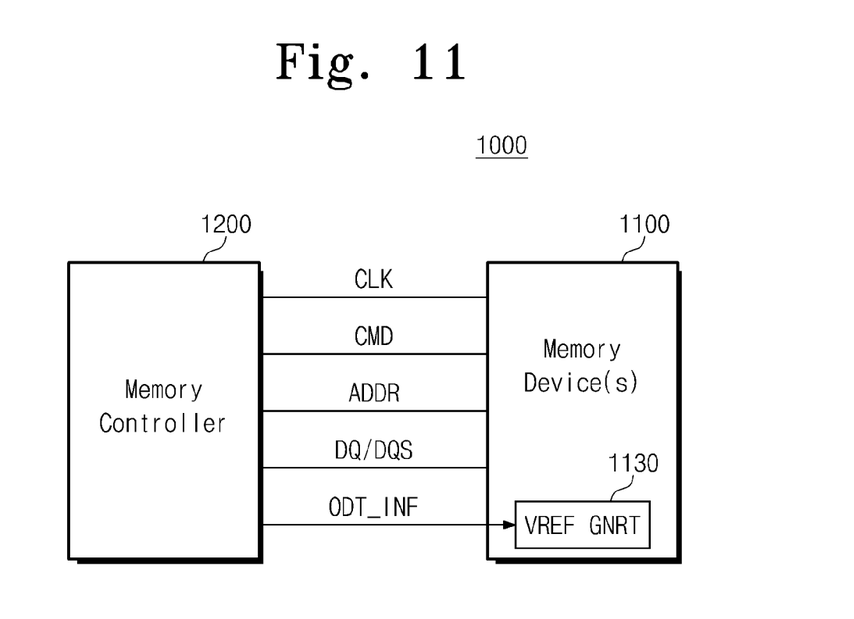
FIG. 11 is a block diagram illustrating an embodiment of a memory system.

FIG. 11 is a block diagram illustrating a first embodiment of a memory system in accordance with some embodiments. Referring to FIG. 11, a memory system 1000 includes at least one memory device 1100 and a memory controller 1200 controlling the memory device 1100. The memory controller 1200 inputs and outputs data DQ/data strobe signal DQS into/from the memory device 1100 according to a clock CLK, a command CMD and an address ADDR. The memory device 1100 includes a reference voltage generator 1130 generating a reference voltage VREF on the basis of ODT information ODT_INF output from the memory controller 1200. The reference voltage VREF is a voltage for determining a logical value of entered data.

The ODT information ODT_INF can be input through a signal line different from the data DQ line. The ODT information ODT_INF can also be input through at least one data DQ line.

The memory controller 1200 can generate an external reference voltage VREF_ext and transmit the external reference voltage VREF_ext to the memory device 1100.

The memory system 1000 can generate the reference voltage VREF on the basis of the ODT information ODT_INF.

Figure 12:
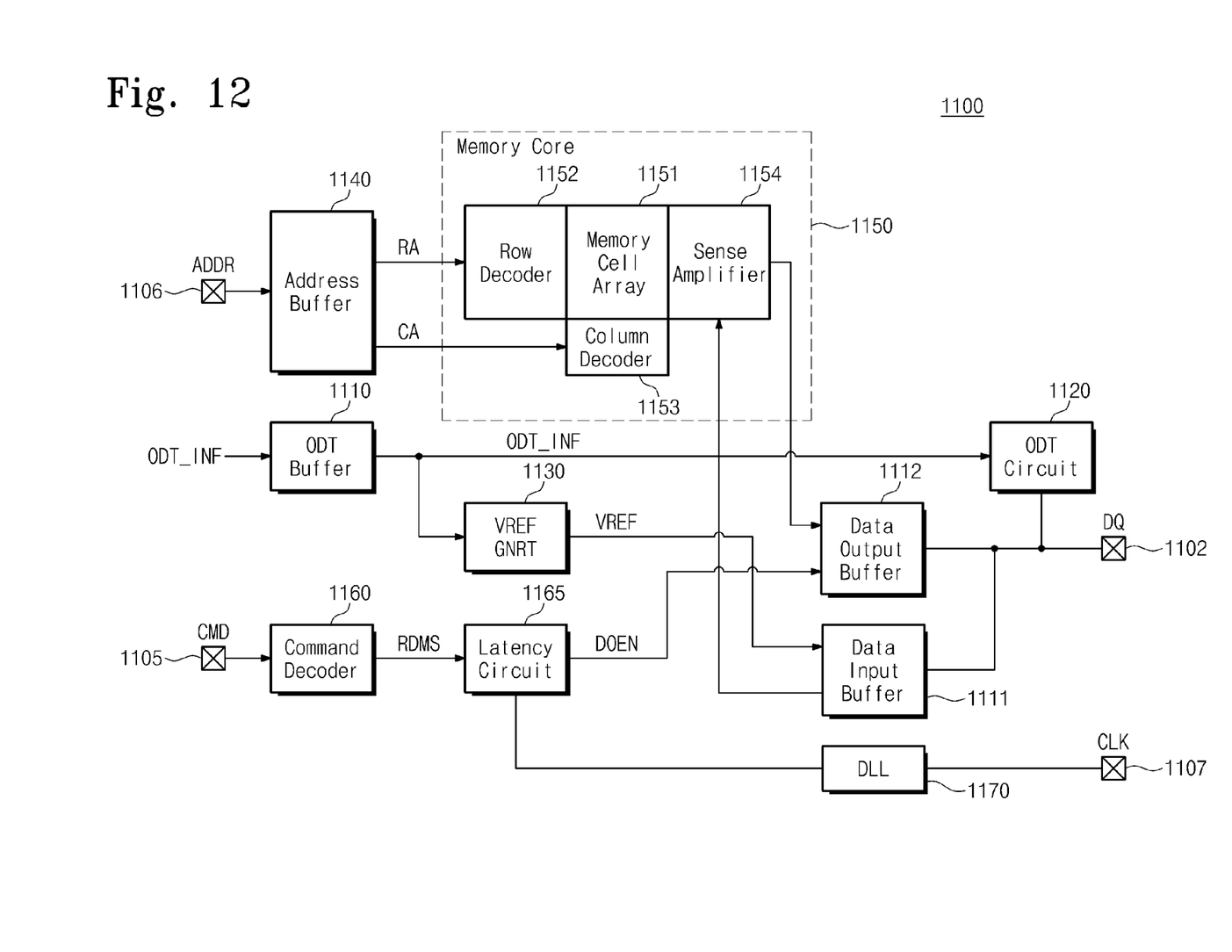
FIG. 12 is a block diagram illustrating a memory device of the embodiment illustrated in FIG. 11.

FIG. 12 is a block diagram illustrating a memory device illustrated in FIG. 11. Referring to FIG. 12, a memory device 1100 includes an ODT buffer 1110, a data output buffer 1112, a data input buffer 1111, an address buffer 1140, an ODT circuit 1120, a reference voltage generator 1130, a memory core 1150, a command decoder 1160, a latency circuit 1165 and a clock synchronizing circuit 1170.

The memory core 1150 stores write data provided from the data input buffer 1111 and generates read data to provide to the data output buffer 1112. The memory core 1150 may include a memory cell array 1151 including a plurality of memory cells storing data, a row decoder 1152 decoding a row address RA which is input from the address buffer 1140 to select a word line of the memory cell array 1151, a column decoder 1153 decoding a column address CA which is input from the address buffer 1140 to select at least one bit line of the memory cell array 1151, and a sense amplifier 1154 sensing data stored in selected memory cells to generate the read data.

The address buffer 1140 provides the row address RA to the row decoder 1152 and the column address CA to the column decoder 1153 on the basis of an address signal ADDR which is input from the memory controller 1200 through an address pad 1106.

The command decoder 1160 can decode a command signal CMD, for example, a write enable signal, a row address strobe signal, a column address strobe signal, a chip select signal, etc., which is input from the memory controller 1200 through a command pad 1105, to generate a control signal corresponding to the command signal CMD.

The memory device 1100 can further include a mode register for a mode register set. The clock synchronizing circuit 1170 can receive an external clock signal CLK through a clock pad 1107 to provide an internal clock signal synchronized with the external clock signal CLK to the latency circuit 1165 and the data output buffer 1112. The clock synchronizing circuit 1170 may include a delay locked loop (DLL) or a phase locked loop (PLL).

The data output buffer 1112 and the data input buffer 1111 are connected to an external data pad 1102. The data output buffer 1112 can transmit the read data to the memory controller 1200 through the external data pad 1102 and the data input buffer 1111 can receive the write data from the memory controller 1200 through the external data pad 1102. For explanation purposes, in FIG. 12, one of each of the data output buffer 1112, the data input buffer 1111 and the data pad 1102 is illustrated. However, the memory device 1100 can include a plurality of data pads, data input buffers and data output buffers. The memory device 1100 can also include a plurality of address pins and command pins.

The ODT circuit 1120 is connected to the data pad 1102 together with the data output buffer 1112 and the data input buffer 1111. For explanation purposes, in FIG. 12, one of each of the data pad 1102 and the ODT circuit 1120 is illustrated, but the memory device 1100 can include a plurality of data pads and a plurality of ODT circuits connected to the plurality of data pads, respectively. A plurality of data pads can share one ODT circuit. The memory device 1100 can further include a data strobe pin, a data mask pin and a termination data strobe pin. The memory device 1100 can also further include ODT circuits which are connected to the data strobe pin, the data mask pin and the termination data strobe pin, respectively, or that are shared with the data strobe pin, the data mask pin and the termination data strobe pin.

The ODT circuit 1120 can vary, change and control a resistance value of a termination resistor according to ODT information ODT_INF that is input from the ODT buffer

1110. The ODT buffer 1110 can receive ODT information ODT_INF from the memory controller 1200 and can buffer the received ODT information ODT_INF to provide the buffered ODT information ODT_INF to the ODT circuit 1120.

The reference voltage generator 1130 can vary, change and control a reference voltage VREF according to ODT information ODT_INF that is input from the ODT buffer 1110. The reference voltage generator 1130 can generate the reference voltage VREF on the basis of the ODT information ODT_INF.

A mode register set (MRS) can be set based on the buffered ODT information ODT_INF. Although not illustrated in the drawing, the ODT circuit 1120 and the reference voltage generator 1130 can operate based on setting information of the mode register set (MRS).

Although not illustrated in the drawing, the memory device 1100 can receive an external reference voltage VREF_ext from an external device. In this case, the memory device 1100 can be embodied to operate substantially like the operation of embodiments of the integrated circuit 200 described in relation to FIG. 9.

The memory device 1100 can generate the reference voltage VREF on the basis of the buffered ODT information ODT_INF to distinguish entered write data using the generated reference voltage VREF. The ODT information ODT_INF can be input in the form of a command.

Figure 13:
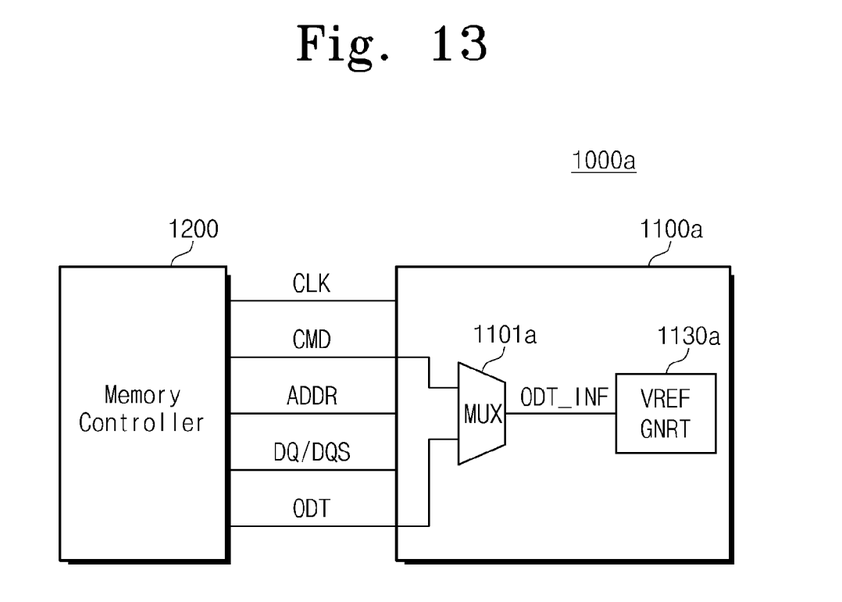
FIG. 13 is a block diagram illustrating another embodiment of a memory system.

FIG. 13 is a block diagram illustrating another embodiment of a memory system. A memory system 1000a includes a reference voltage generator 1130a receiving ODT information ODT_INF that is based on a combination of information from a command signal CMD combined with an ODT signal in a multiplexer 1101a to generate a reference voltage VREF on the basis of the received ODT information ODT_INF.

Figure 14:
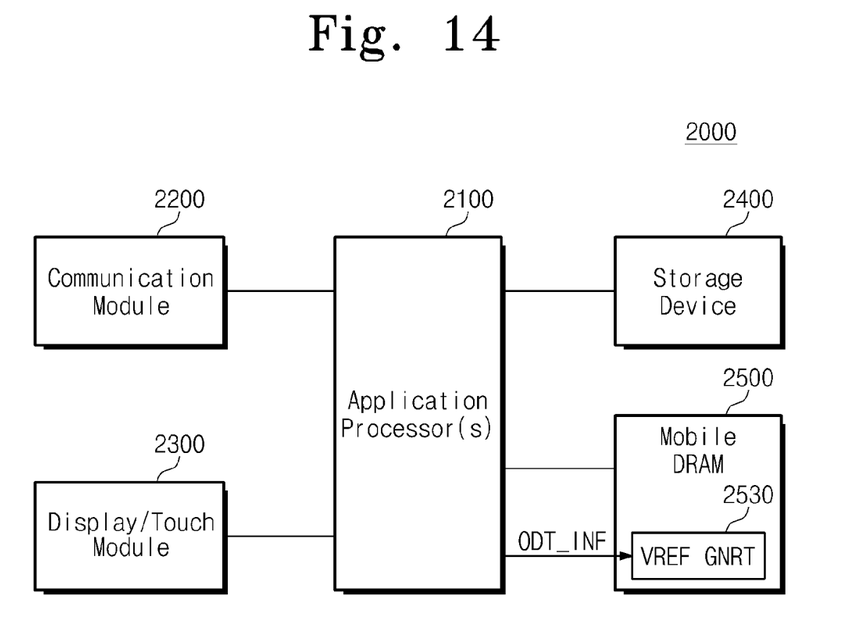
FIG. 14 is a block diagram illustrating an embodiment of a mobile device.

FIG. 14 is a block diagram illustrating an embodiment of a mobile device. A mobile device 2000 includes an application processor 2100, a communication module 2200, a display/touch module 2300, a storage device 2400 and a mobile DRAM 2500.

The application processor 2100 controls an overall operation of the mobile device 2000. The communication module 2200 controls wired/wireless communication with an external device. The display/touch module 2300 displays data processed by the application processor 2100 or receives data from a touch panel.

The storage device 2400 stores user data. The storage device 2400 may be, for example an eMMC (embedded multimedia card), a SSD (solid state drive) or a UFS (universal flash storage).

The mobile DRAM 2500 can temporarily store data needed when a processing operation of the mobile device 2000 is performed. The mobile DRAM 2500 can be implemented by various embodiments such as the integrated circuits 100, 100a and 200 illustrated above with reference to FIGS. 1 through 9. The mobile DRAM 2500 may include a reference voltage generator 2530 generating a reference voltage on the basis of ODT information ODT_INF, for example as discussed above for voltage generators 130, 130a and 230 in the embodiments discussed above. The mobile DRAM 2500 may, for example, be from a low power DDR (LPDDR) series.

In the example of FIG. 14, the ODT information ODT_INF is internally generated in the mobile DRAM 2500.

Figure 15:
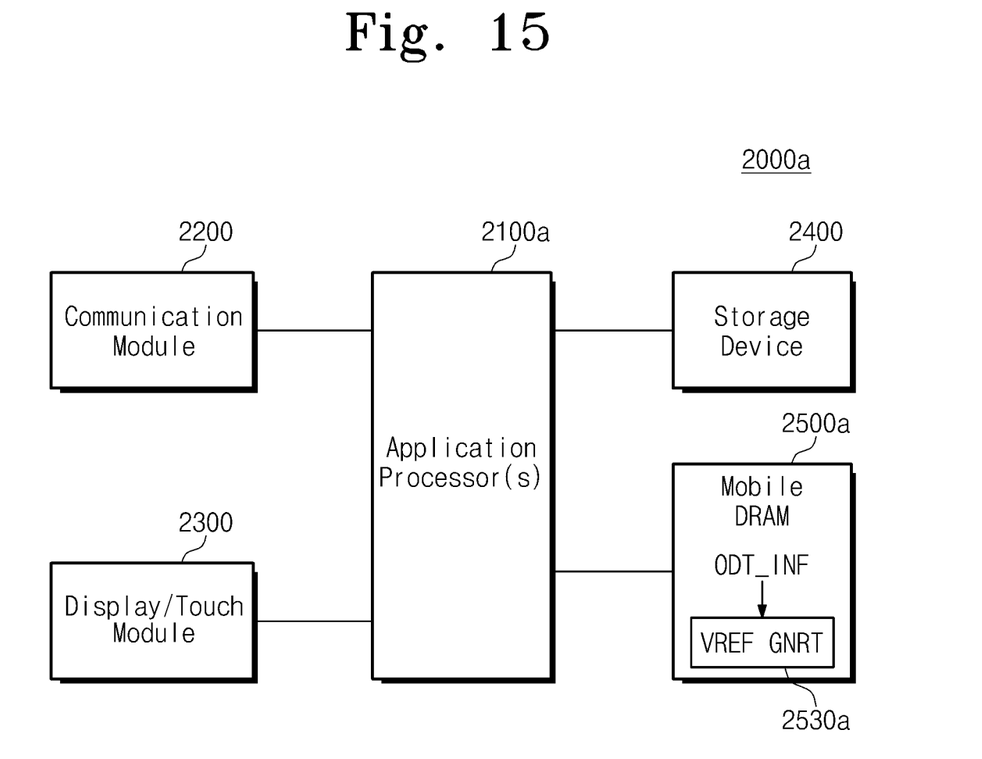
FIG. 15 is a block diagram illustrating another embodiment of a mobile device.

FIG. 15 is a block diagram illustrating another embodiment of a mobile device. Mobile device 2000a includes an application processor 2100a, a communication module 2200, a display/touch module 2300, a storage device 2400 and a mobile DRAM 2500a. Illustratively, a reference voltage generator 2530a can generate a reference voltage VREF on the basis of internally generated ODT information ODT_INF.

The memory system or the storage device in accordance with some embodiments of the inventions can be mounted using various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

As described above, an integrated circuit in accordance with the inventions provides various advantages, such as optimizing performance according to an operation frequency when a data input operation is performed by generating a reference voltage on the basis of ODT information to distinguish data using the generated reference voltage.

Although various embodiments have been described and illustrated above, the inventions are not limited to these. It will be apparent to those skilled in the art that various substitutions, modifications and changes may be made thereto without departing from the scope and spirit of the inventive concept.

What is claimed is:

1. An integrated circuit comprising:
a pad configured to receive an external data signal input;
an on-die termination (ODT) information input configured to receive ODT information from an external device;
an ODT circuit configured to selectively couple a termination resistor to the pad based on the ODT information;
an input buffer coupled to the pad and configured to determine a data value based on a reference voltage; and
a reference voltage generator coupled to the input buffer and configured to generate the reference voltage based on the ODT information,
wherein the termination resistor comprises at least one pull-up resistor and at least one pull-down resistor, and the ODT circuit includes:
a pull-up termination circuit including the at least one pull-up resistor selectively coupled between the pad and a first power supply voltage based on the ODT information; and
a pull-down termination circuit including the at least one pull-down resistor selectively coupled between the pad and a second power supply voltage based on the ODT information, and
wherein the ODT information comprises on/off information indicating a first selection of ODT operation between an on state and an off state and information indicating a second selection between the pull-up termination circuit and the pull-down termination circuit.

2. The integrated circuit of claim 1, wherein the ODT information further comprises a third selection between a plurality of ODT resistance values.

3. The integrated circuit of claim 2, further comprising a mode register configured to provide least a portion of the ODT information.

4. The integrated circuit of claim 1, wherein the integrated circuit is a DRAM configured to receive the ODT information from a memory controller.

5. The integrated circuit of claim 1, wherein the reference voltage generator comprises a voltage divider configured to generate the reference voltage from a power supply voltage based on the ODT information.

6. The integrated circuit of claim 5, wherein the reference voltage generator is configured to generate a reference voltage of half the power supply voltage if the ODT information selects the ODT off state.

7. The integrated circuit of claim 5, wherein the reference voltage generator is configured to generate a reference voltage of less than half of the power supply voltage if the ODT information selects the pull-down termination circuit.

8. The integrated circuit of claim 5, wherein the reference voltage generator is configured to generate a reference voltage of greater than half of the power supply voltage if the ODT information selects the pull-up termination circuit.

9. The integrated circuit of claim 1, wherein the reference voltage generator comprises:
an external reference voltage input configured to receive an external reference voltage;
a voltage divider configured to generate an internal reference voltage from a power supply voltage based on the ODT information; and
a switch configured to select between the external reference voltage and the internal reference voltage as the reference voltage based on whether the ODT information indicates an ODT off state.

10. The integrated circuit of claim 1, further comprising an output buffer separate from the input buffer, the output buffer coupled to the pad and configured to output data through the pad, and wherein the output buffer includes the ODT circuit.

11. An integrated circuit comprising:
a data pad;
an on-die termination (ODT) circuit coupled to the data pad, the ODT circuit including (i) an ODT information input, (ii) at least one termination resistor, and (iii) circuitry configured to selectively couple the termination resistor(s) to the data pad based on ODT information received from the ODT information input;
a voltage reference generator configured to generate a voltage reference based on the ODT information; and
a data input buffer coupled to the data pad and to the voltage reference generator,
wherein the voltage reference generator is further configured to:
generate a reference voltage equal to one-half of a power supply voltage if the ODT information indicates not to perform an ODT operation;
generate a reference voltage less than one-half of the power supply voltage if the ODT information indicates (i) to perform an ODT operation and (ii) a pull-down termination; and
generate a reference voltage greater than one-half of the power supply voltage if the ODT information indicates (iii) to perform an ODT operation and (iv) a pull-up termination.

12. The integrated circuit of claim 11, wherein the voltage reference generator includes:
an input receiving an external voltage reference;
a voltage divider configured to provide an internal voltage reference based on the ODT information; and
a selection circuit configured to select based on the ODT information between the external voltage reference and the internal voltage reference to generate the voltage reference.

13. A data input method for a memory device configured to be coupled to a memory controller comprising:
receiving on-die termination (ODT) information from a memory controller;
generating a reference voltage based on the ODT information;
performing an ODT termination based on the ODT information; and
determining a data value of a signal input into a data pad based on the reference voltage,
wherein the ODT information includes on/off information indicating whether to perform an ODT operation, termination information indicating a pull-up termination or a pull-down termination, and resistance information indicating an ODT resistance value, and
wherein generating a reference voltage based on the ODT information comprises:
generating a reference voltage equal to one-half of a power supply voltage when the performance information of the ODT operation selects the off state;
generating a reference voltage less than one-half of the power supply voltage when the performance information of the ODT operation selects the on state and the termination information selects the pull-down termination; and
generating a reference voltage greater than one-half of the power supply voltage when the performance information of the ODT operation selects the on state and the termination information selects the pull-up termination.

14. The method of claim 13, wherein generating a reference voltage based on the ODT information comprises:
receiving an external voltage reference;
providing an internal voltage reference based on the ODT termination information; and
selecting the internal voltage reference as the reference voltage if the on/off information indicates to perform an ODT operation, or
selecting the external voltage reference as the reference voltage if the on/off information indicates not to perform an ODT operation.

* * * * *